United States Patent [19]
Hakkarainen et al.

[11] Patent Number: 6,119,175
[45] Date of Patent: Sep. 12, 2000

[54] ON-CHIP COMMUNICATION CIRCUIT AND PROTOCOL FOR MICROCONTROLLER-BASED ASICS

[75] Inventors: Juka Mikko Hakkarainen, Coconut Grove, Fla.; Nga Cheung Lee, Schenectady, N.Y.; Chung-Yih Ho, Chavenay, France

[73] Assignee: General Electric Company, Schenectady, N.Y.

[21] Appl. No.: 09/093,531

[22] Filed: Jun. 8, 1998

Related U.S. Application Data

[62] Division of application No. 08/621,020, Mar. 22, 1996, Pat. No. 5,799,211.

[51] Int. Cl.[7] ............................................. G06F 12/00
[52] U.S. Cl. ........................... 710/22; 710/27; 710/52
[58] Field of Search .............................. 341/100; 710/28, 710/128, 22, 100, 129, 27, 52; 702/122; 370/216

[56] References Cited

U.S. PATENT DOCUMENTS

| | | | |
|---|---|---|---|
| 4,429,300 | 1/1984 | Yamasawa et al. | 341/100 |
| 4,970,714 | 11/1990 | Chen et al. | 370/216 |
| 5,428,770 | 6/1995 | Garner | 702/122 |
| 5,561,821 | 10/1996 | Gephardt et al. | 710/28 |
| 5,664,117 | 9/1997 | Shah et al. | 710/100 |
| 5,673,400 | 9/1997 | Kenny | 710/129 |
| 5,678,064 | 10/1997 | Kulik et al. | 710/28 |
| 5,721,545 | 2/1998 | Poplevine | 341/100 |
| 5,729,762 | 3/1998 | Kardach et al. | 710/22 |
| 5,740,385 | 4/1998 | Hayek et al. | 710/128 |

*Primary Examiner*—Albert De Cady
*Assistant Examiner*—David Ton
*Attorney, Agent, or Firm*—Marvin Snyder; Douglas E. Stoner

[57] ABSTRACT

A communications unit configured to be implemented in an ASIC environment utilizes only a small amount of chip surface area and requires a minimum number of pins. The unit operates asynchronously with respect to the ASIC internal clock so that communications can occur independent of such internal clock. In one embodiment the communications unit includes a controller coupled to a shift register via a data bus. Pin connections to the controller include a request line REQ, an input/output control line I/O (or INOUT), an acknowledgement line ACK, an external clock line EXTCLK, and a data line DATA. The shift register also is coupled, via a data bus, to a memory module, e.g., a RAM. An ASIC processor is coupled to the controller, shift register and memory module via control lines.

18 Claims, 4 Drawing Sheets

ON-CHIP COMMUNICATION CIRCUIT AND PROTOCOL FOR MICROCONTROLLER-BASED ASICS

This application is a division, of application Ser. No. 08/621,020, filed Mar. 22, 1996, now U.S. Pat. No. 5,799, 211.

FIELD OF THE INVENTION

This invention relates generally to microcontroller based application specific integrated circuits (ASICs) and, more particularly, to a communication unit for such ASICs.

BACKGROUND OF THE INVENTION

Microcontroller based application specific integrated circuits (ASICs) are used in many different applications. Such ASICs presently are used, for example, in power delivery components such as circuit breakers. In circuit breaker applications, the ASICs are programmed to control opening and closing of a power switch, or relay, electrically connected to designated branches of the power delivery network.

In circuit breaker applications, the ASIC controls the breaker to trip under certain predefined conditions. Such conditions include detection of a fault, an overcurrent condition, and many other conditions generally detrimental to the power delivery network. Once the circuit breaker trips, a utility worker typically will visit the site of the breaker in an attempt to correct the root cause which caused the breaker to trip. The root cause may be identified by performing certain testing on the power delivery components.

To reduce the time required to locate the trip root cause, it would be beneficial to obtain information from the circuit breaker ASIC which identifies the cause for the trip. If such information were available to the utility worker, the root cause probably could be identified more quickly and efficiently.

Known communication units suitable for implementation on an ASIC, however, generally require a large amount of chip surface area. Of course, and particularly with ASICs, occupying a large amount of chip surface area is highly undesirable. In addition to requiring a large amount of chip area, known communication units require a large number of pins. Such pins are used in accordance with the communication protocol to read and write data to the ASIC. Of course, if a large number of pins are required for communications, fewer pins are available for other functions. Further, known ASIC communication units typically operate synchronously with the ASIC internal clock. Such synchronous communication requirements, however, slows down the communication process.

It would be desirable to provide a communication unit suitable for implementation on an ASIC which requires only a small amount of chip surface area and a minimum number of pins. It also would be desirable to provide such a communication unit which operates asynchronously with respect to the ASIC internal clock so that communications can occur independent of such internal clock.

SUMMARY OF THE INVENTION

These and other objects may be attained in a communications unit for implementation in an ASIC environment and which, in one embodiment, includes a controller coupled to a shift register via a data bus. Pin connections to the controller include a request line REQ, an input/output control line I/O (or INOUT), an acknowledgement line ACK, an external clock line EXTCLK, and a data line DATA. The shift register also is coupled, via a data bus, to a memory module, e.g., a RAM. The ASIC processor is coupled to the controller, shift register and memory module via control lines.

With such a configuration, both read and write operations can be performed using an external communications unit. Importantly, only a small amount of chip surface area and a minimum number of pins are required. Further, the communication unit operates asynchronously with respect to the ASIC internal clock so that communications can occur independent of such internal clock.

BRIEF DESCRIPTION OF THE DRAWINGS

The features of the invention believed to be novel are set forth in the appended claims. The invention, however, together with further objects and advantages thereof, may best be understood by reference to the following description taken in conjunction with the accompanying drawing(s) in which:

DETAILED DESCRIPTION OF THE DRAWINGS

Figure 1:
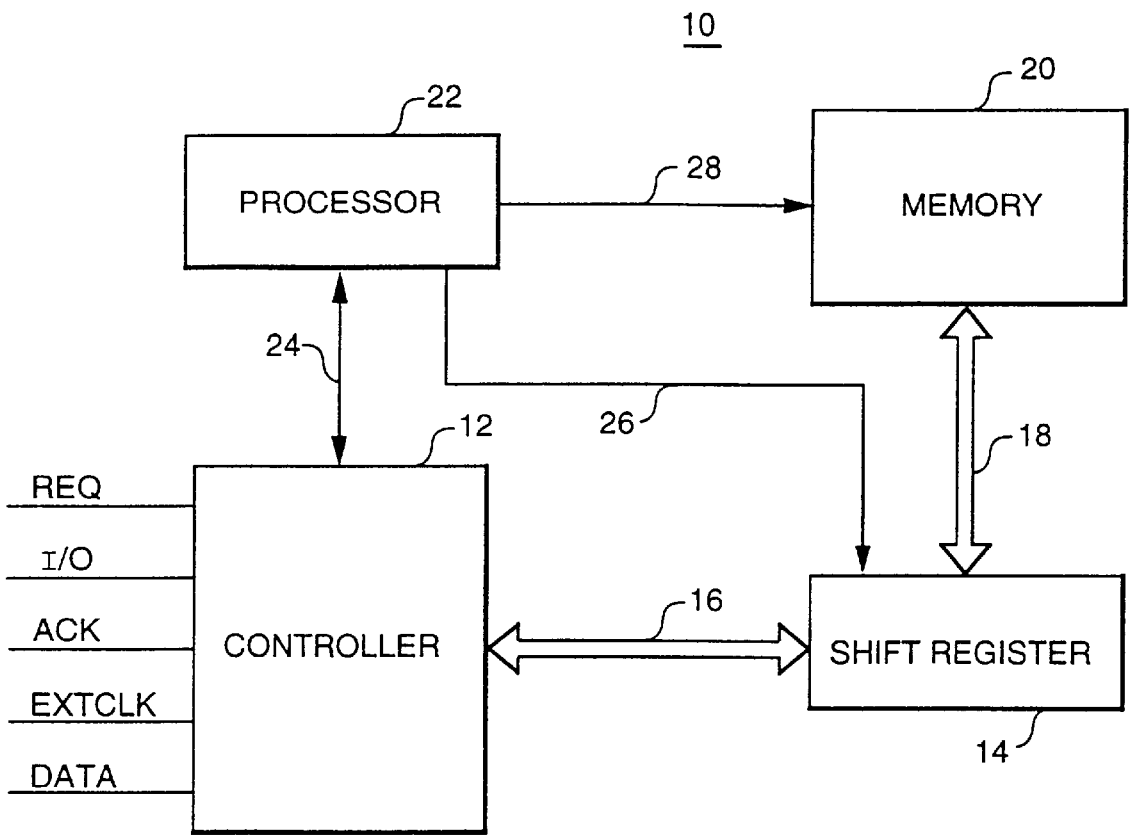
FIG. 1 is a block diagram illustrating a communications unit in accordance with one embodiment of the present invention.

FIG. 1 is a block diagram illustrating a communications unit 10 in accordance with one embodiment of the present invention. Communications unit 10 includes a controller 12 coupled to a shift register 14 via a data bus 16. Pin connections to controller 12 include a request line REQ, an input/output control line I/O (or INOUT), an acknowledgement line ACK, an external clock line EXTCLK, and a data line DATA.

Shift register 14 also is coupled, via a data bus 18, to a memory module 20, which may be a random access memory (RAM). A processor 22 is coupled to controller 12, shift register 14 and memory module 20 via control lines 24, 26 and 28, respectively.

Controllers, shift registers, processors, memories, data buses and control lines are well known in the ASIC art. Such components can be implemented on an ASIC using well known and understood techniques. In addition, such components may be configured for performing many functions in addition to communicating with an external control. ASIC processor 22, for example, is utilized in performing communications as described in more detail below but also typically is configured to perform many functions in addition to communications. For example, in a circuit breaker application, ASIC processor 22 would receive data from a central computer to determine whether the breaker should trip, or to alter the internal trip condition parameters of the breaker.

Controller 12 includes an end of word (EOW) status bit, a receive in progress (RIP) status bit, a transmit in progress (TIP) status bit, a read (R) status bit, a write (W) status bit, and a transmit (XMT) status bit. The status bits are set by microcode internal to processor 10 in accordance with the methods described hereinafter in more detail. Controller 12 also includes a bit counter (bitcntr) which counts the number of bits that pass through controller 12 and a word counter which counts the total number of words (e.g., 32 bits) that pass through controller 12, in each receive and transmit operation.

To communicate with unit 10, an external communications unit or central computer (not shown) couples with controller 12. Specifically, the external communications unit includes pin connectors which mate with each of the above described controller pins. The external communications unit also includes an external clock to set the rate of data transfer between controller 12 and the external communications unit. Such external communications units are well known in the art.

Communications unit 10 is operable in either of a receive mode and a transmit mode. In the receive mode, data are transferred from the external communications unit to unit 10. In the transmit mode, data are transferred from unit 10 to the external communications unit.

Figure 2:
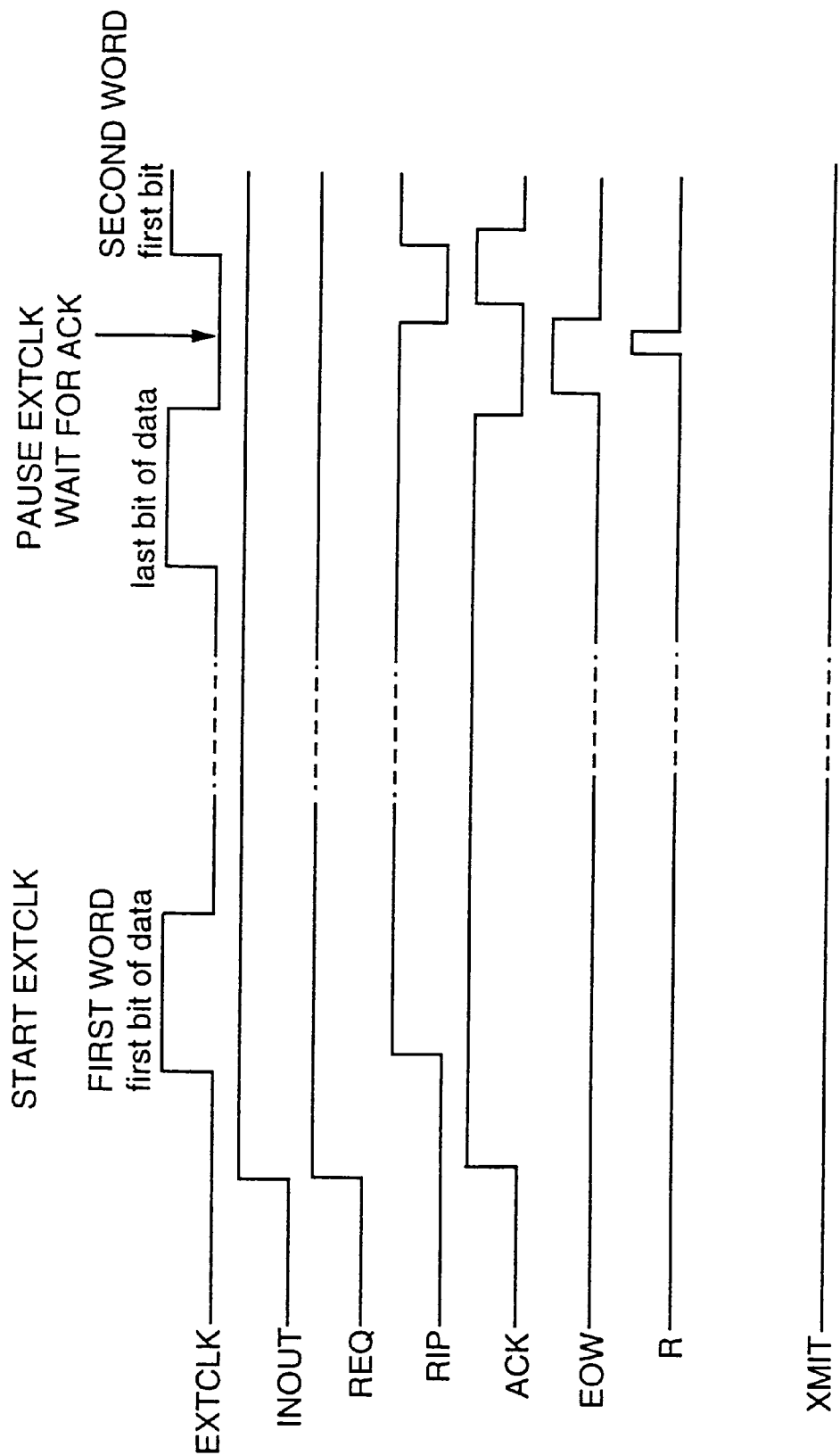
FIG. 2 is a timing diagram illustrating the receive data mode of operation of the communication unit illustrated in FIG. 1.

A timing diagram illustrating the receive mode of operation is shown in FIG. 2, and is initiated when the external communications unit sets INOUT and REQ lines high. Controller 12 responds with a high signal on the ACK line if the RIP (receive in progress) status bit is low. Once the ACK line is high, the EXTCLK (external clock input) line is enabled by controller 12 so that the external communications unit can provide clock signals to controller 12. On the first rising edge of the EXTCLK signal, the RIP status bit is set high by controller 12.

The first bit of the data word is then transmitted from the external unit to controller 12 via the DATA line. The bits are transmitted synchronously with the external clock rather than with the internal processor clock. Therefore, communications typically are asynchronous with the ASIC internal clock. As bits are communicated to controller 12, each transmitted bit is loaded into shift register 14 via data bus 16 (FIG. 1). In one form, the input words are thirty two bits long and the bit counter internal to controller 12 indicates the end of the word by setting a status bit, e.g., an EOW (end of word) bit, high after thirty two bits have been received.

The EOW status bit is monitored by controller 12 so that when the EOW status bit is high, controller 12 communicates with processor 22 and instructs processor 22 to cause shift register 14 to parallel transfer the just received, and complete, word to a location in memory module 20. As shown in FIG. 2, such transfer is triggered by the read R status bit which controller 12 sets high when the EOW bit is high. Upon transmission, controller 12 changes the RIP status bit state to low.

The word counter of controller 12 tracks the total number of words entered in the communications session. Processor 22 determines the proper word address for the newly received data stored in memory module 20. The EOW status bit is reset by the microcode of processor 22 once a word has been completely received and stored in memory module 20 and provided that no other activity in processor 10 is interrupted.

Figure 3:
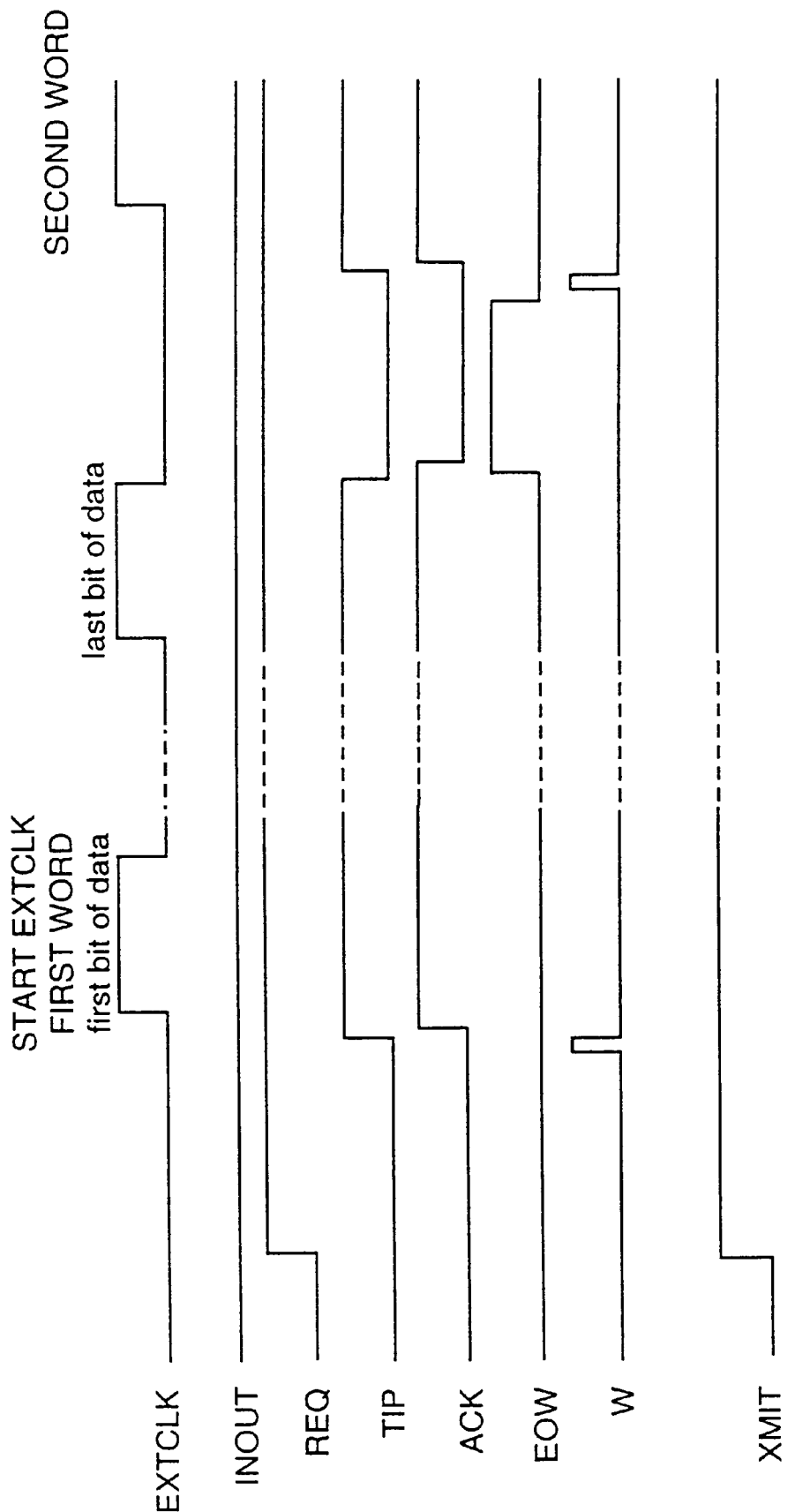
FIG. 3 is a timing diagram illustrating the transmit data mode of operation of the communication unit illustrated in FIG. 1.

With respect to transmitting a word from controller 12 to the external communications unit, a timing diagram for the transmit data mode is shown in FIG. 3. The transmit mode is initiated when the external control unit sets the INOUT line low and the REQ line high. Controller 12 responds by setting a XMT status bit high if a transmit in progress TIP status bit is low. Under such conditions, controller 12 instructs processor 22 to parallel load a word from memory module 20 to shift register 14 for transmission. Such a load is triggered by a write W status bit which controller 12 sets high, as shown in FIG. 3.

Upon triggering of the write W status bit, the bit and word counters are reset and the transmit in progress TIP bit and the acknowledgement ACK bit are set high in controller 12. When the acknowledgement ACK bit is high, the EXTCLK line is enabled, allowing transmission of bits from shift register 14 to begin.

The bit counter counts the number of bits transferred from shift register 14 to controller 12, and when the preset number of bits have been transmitted (e.g., thirty two bits), the end of word EOW status bit is set high. When the end of word EOW status bit goes high, controller 12 drives the acknowledgement ACK line low. If another word is desired by the external unit, the write process described above is reinitiated. Controller 12 and processor 22 monitor and set the EOW and XMT lines to initiate the appropriate action.

With respect to both the receive and transmit modes described above, processor 22 and controller 12 monitor the end of word EOW, transmit in progress TIP, and transmit XMT status bits. The external communication unit enables an external clock EXTCLK on the rising edge of the signal present on the ACK line, resets the REQ line, and stops accepting data or sending data when the acknowledgement ACK line is low.

Communications unit 10 is suitable for implementation on an ASIC and requires only a small amount of chip surface area and a minimum number of pins. Further, communications unit 10 operates asynchronously with respect to the ASIC internal clock so that communications can occur independent of such internal clock.

Figure 4:
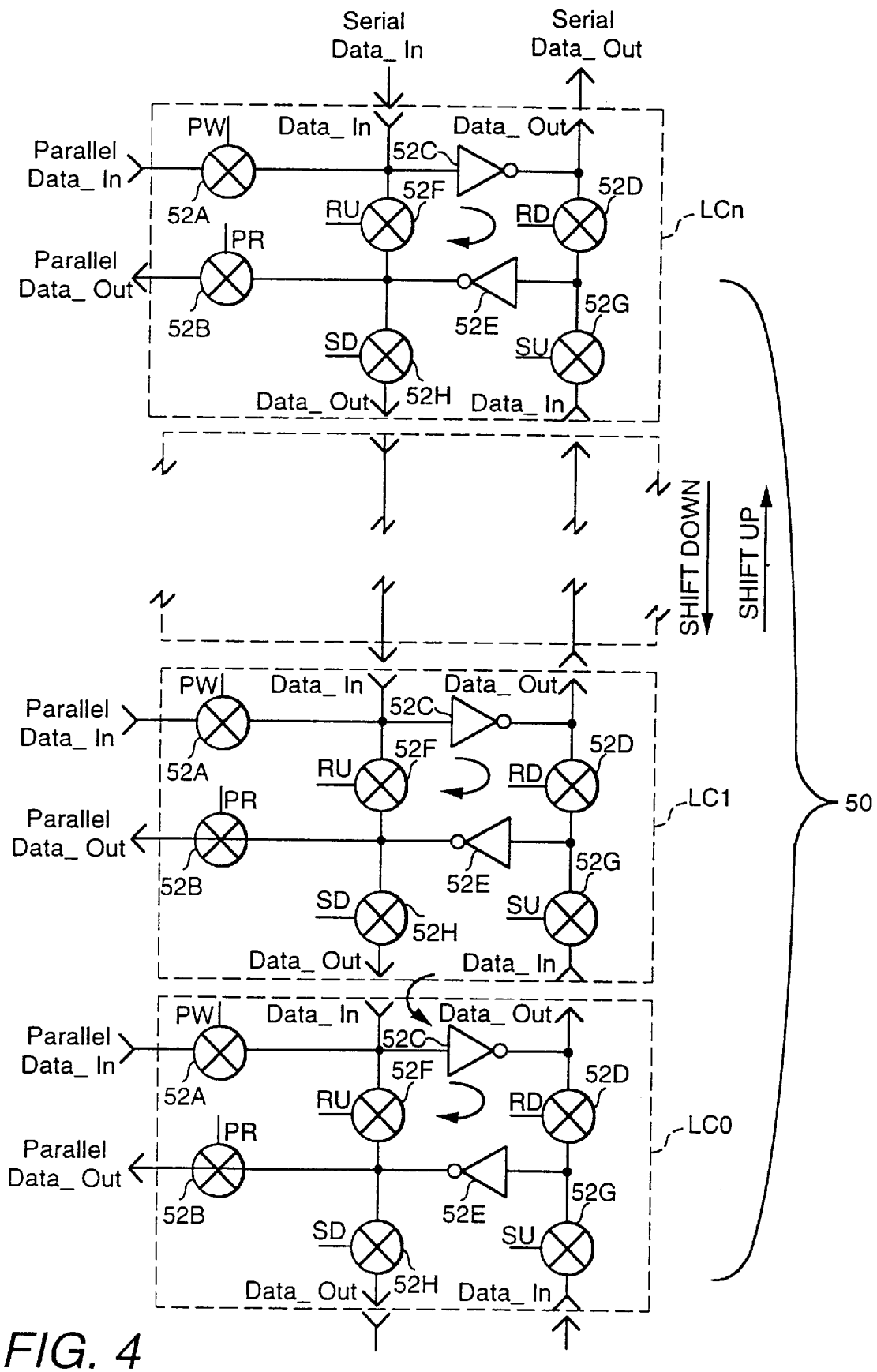
FIG. 4 schematically illustrates a bi-directional shift register operable in both serial and parallel read and write modes that can be used in the communication unit illustrated in FIG. 1.

A shift register 50, which may be used in communications unit 10 as shift register 14 (FIG. 1), is illustrated in circuit schematic form in FIG. 4. Shift register 50 is operable in serial-in / parallel out and parallel-in / serial-out modes. More specifically, register 50 comprises a plurality of latchcells designated LC0, LC1 . . . LCn. The number of latchcells typically is selected to match the word size. Also, each latchcell is constructed identical to all other latchcells and therefore, by describing latchcell LC0 below in detail, it should be understood that such description also describes all other latchcells of register 50.

Latchcell LC0 includes a parallel load (WRITE) switch 52A and a parallel read switch 52B. Parallel load switch 52A is coupled to the input of an inverter 52C, and the output of inverter 52C is coupled to a read down switch 52D. The output of read down switch 52D is coupled to the input of an inverter 52E. The output of inverter 52E is coupled to the inputs of a read up switch 52F and parallel read switch 52B. The output of a shift up switch 52G is also coupled to the input of inverter 52E. The output of inverter 52E is also coupled as an input to a shift down switch 52H. All switch signals and timing are controlled by processor 22 (FIG. 1).

With respect to interconnections between latchcell LC0 and latchcell LC1, which are identical to the interconnections between the other latchcells, the DATA_IN and DATA_OUT ports of latchcell LC0 are coupled to the DATA_OUT and DATA_IN ports of latchcell LC1, respectively. With respect to latchcell LC0, the SERIAL DATA OUT port is coupled to shift down switch 52H and the SERIAL DATA IN port is coupled to shift up switch 52G. Serial data may also be provided to shift register 50 from latchcell LCn via the DATA IN and DATA OUT ports coupled to read up switch 52F and read down switch 52D, as shown.

For parallel communications with register 50, parallel data are written to register 50 via the PARALLEL DATA_IN port coupled to parallel write switch 52A. Parallel data are read from the PARALLEL DATA_OUT port coupled to parallel read switch 52B.

To shift-up data bits stored in latchcell LCO to latchcell LC1, the following sequence of commands is performed:
SU enable
RU enable
RD enable
SU disable The command "SU enable" means that shift up switches 52G in latchcell LCO and LC1 are enabled. The command "RU enable" means that read up switches 52F are enabled. The command "RD enable" means that read down switches 52D are enabled. The command "SU disable" means that shift down switches 52H are disabled. The clockwise loops shown in FIG. 4 indicate the loops in which data are stored in the shift-up operation.

To shift-down data bits stored in latchcell LC1 to latchcell LCO, the following sequence of commands is performed:
SD enable
RD enable
RU enable
SD disable The command "SD enable" means that shift down switches 52H in latchcells LCO and LC1 are enabled. The command "RD enable" means that read down switches 52D are enabled. The command "RU enable" means that read up switches 52F are enabled. The command "SU disable" means that shift down switches 52H are disabled. The counter-clockwise loops shown in FIG. 4 indicate the loops in which data are stored in the shift-down operation.

To parallel load (write) data bits into register 50, the following sequence of commands is performed:
PW enable
RD enable
RU enable
PW disable The command "PW enable" means that parallel load switches 52A are enabled. The command "RD enable" means that read down switches 52D are enabled. The command "RU enable" means that read up switches 52F are enabled. The command "PW disable" means that parallel load switches 52A are disabled. To parallel read data bits from register 50, parallel read switches 52B are enabled while read down switches 52D and read up switches 52F are selectively enabled.

As described above, by controlling the sequence of switching, shift register 50 can be operated in serial in - parallel out, parallel in - serial out, shift up (shift left) and shift down (shift right) modes. Such flexibility may be desired in some applications.

While only certain preferred features of the invention have been illustrated and described, many modifications and changes will occur to those skilled in the art. It is, therefore, to be understood that the appended claims are intended to cover all such modifications and changes as fall within the true spirit of the invention.

What is claimed is:

1. A communications unit comprising:
   a controller comprising a request line connection, an input/output control line connection, an acknowledgment line connection, an external clock line connection, and a data line connection;
   a shift register coupled to said controller by a first data bus; and
   a memory module coupled to said shift register by a second data bus;
   said external clock line connection being adapted to initiate supply of clock signals to said controller upon supply at a high signal on the acknowledgment line connection produced in response to said input/output control line connection and said request line connection both being set high.

2. The communications unit of claim 1 wherein said controller further includes an end of word (EOW) status bit, a receive in progress (REP) status bit, a transmit in progress (TIP) status bit, a read (R) status bit, a write (W) status bit, and a transmit (XMT) status bit.

3. The communications unit of claim 2 wherein said unit is adapted to communicate with an external communications unit, the external communications unit being capable of initiating a receive mode of operation by setting said input/output control line connection high and said request line connection high.

4. The communications unit of claim 3 wherein said controller is adapted to respond to the external communications unit initiating the receive mode of operation by setting said acknowledgement line connection high if said receive in progress status bit is low.

5. The communication unit of claim 3 wherein the external communications unit is adapted to initiate a transmit mode of operation by setting said input/output control line low and said request line high.

6. The communications unit of claim 5 wherein, subsequent to the external communications unit initiating the transmit mode of operation, said controller is adapted to set said transmit status bit high if said transmit in progress status bit is low.

7. The communications unit of claim 6 wherein said controller is adapted to set said write status bit high to cause a word to be transferred from said memory module to said shift register once said transmit status bit is high.

8. The communications unit of claim 1 wherein said controller is adapted to transmit bits from said shift register through to the external communications unit when said acknowledgment bit is high as a result of said external clock line being enabled.

9. The communications unit of claim 1 wherein said receive in progress status bit is adapted to be set high, subsequent to enabling said external clock line, on the first rising edge of a clock signal provided by the external communications unit.

10. The communications unit of claim 9 wherein a first bit of a data word is transmitted from the external communications unit to said controller on said data line, the bit being transmitted synchronously with the timing signal present on said external clock line, subsequent to said receive in progress status bit having been set high.

11. The communications unit of claim 10 wherein said controller further comprises a bit counter, incrementable by one for each bit transmitted to said controller and subsequently loaded into said shift register.

12. The communications unit of claim 11 wherein said end of word status bit is set high when said bit counter reaches a predetermined count value.

13. The communications unit of claim 12 wherein when said end of word status bit is high, the data in said shift register are transmitted to said memory module.

14. The communications unit of claim 7 wherein said controller further comprises a word counter for tracking a total number of words entered into said controller during a communication session.

15. A communications unit implemented on an application specific integrated circuit for communicating with an external communications unit, comprising:

a controller comprising a request line pin connection, an input/output control line pin connection, an acknowledgment line pin connection, an external clock line pin connection, and a data line pin connection, said controller further comprising an end of word (EOW) status bit, a receive in progress (RIP) status bit, a transmit in progress (TIP) status bit, a read (R) status bit, a write (W) status bit, and a transmit (XMT) status bit;

a shift register coupled to said controller by a first data bus; and a memory module coupled to said shift register by a second data bus;

said external clock line connection being adapted to initiate supply of clock signals to said controller upon supply of a high signal on the acknowledgment line connection produced in response to said input/output control line connection and said request line connection both being set high;

said controller being operable in a receive mode of operation so that data can be transferred from the external communications unit to said memory module and so that data stored in said memory module can be transferred to the external communications unit.

16. The communications unit of claim 15 wherein the external communications unit is adapted to initiate the receive mode of operation by setting said input/output control line pin connection high and said request line pin connection high, and wherein subsequent to the external communications unit initiating the receive mode of operation, said controller is adapted to respond by setting said acknowledgement line pin connection high if said receive in progress status bit is low.

17. The communications unit of claim 15 wherein the external communications unit is adapted to initiate the transmit mode of operation by setting said input/output control line low and said request line high, and wherein subsequent to the external communications unit initiating the transmit mode of operation, if said transmit in progress status bit is low, said controller is adapted to set said transmit status bit high.

18. The communications unit of claim 16 wherein said shift register is operable in a serial-in/parallel-out mode and in a parallel-in/serial-out mode of data transfer.

* * * * *